(12) United States Patent  (10) Patent No.: US 8,988,131 B2
Sadate et al.  (45) Date of Patent: Mar. 24, 2015

(54) TRANSISTOR SWITCH INCLUDING INDEPENDENT CONTROL OF TURN-ON AND SLEW RATE

(71) Applicant: Texas Instruments Incorporated, Dallas, TX (US)

(72) Inventors: Aline Claude Sadate, Allen, TX (US); Richard Turkson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/946,345

(22) Filed: Jul. 19, 2013

(65) Prior Publication Data

US 2015/0022258 A1  Jan. 22, 2015

(51) Int. Cl.
*H03K 17/04* (2006.01)
*H03K 17/284* (2006.01)

(52) U.S. Cl.
CPC .................. *H03K 17/284* (2013.01)
USPC ........................ 327/376; 327/394

(58) Field of Classification Search
CPC ............ H03K 17/04; H03K 17/041; H03K 17/04106; H03K 17/0412; H03K 17/04123
USPC ......... 327/170, 374, 376, 377, 392–394, 398, 327/399
See application file for complete search history.

(56) References Cited

U.S. PATENT DOCUMENTS

| | | | | |
|---|---|---|---|---|
| 5,204,562 A * | 4/1993 | Pace | | 327/381 |
| 5,315,174 A * | 5/1994 | Chang et al. | | 326/27 |
| 5,539,341 A * | 7/1996 | Kuo | | 327/108 |
| 5,543,739 A * | 8/1996 | Bontempo et al. | | 327/108 |
| 5,834,964 A * | 11/1998 | Scheraga | | 327/376 |
| 6,018,263 A * | 1/2000 | Tihanyi | | 327/374 |
| 6,208,177 B1 * | 3/2001 | Knoedl, Jr. | | 327/108 |
| 6,407,594 B1 * | 6/2002 | Milazzo et al. | | 327/112 |
| 6,958,631 B2 * | 10/2005 | Aiba et al. | | 327/112 |
| 7,924,081 B2 * | 4/2011 | Lorenzo et al. | | 327/376 |
| 8,633,755 B2 * | 1/2014 | Kawamoto et al. | | 327/309 |
| 8,779,805 B1 * | 7/2014 | Fernandez et al. | | 327/108 |

* cited by examiner

*Primary Examiner* — William Hernandez
(74) *Attorney, Agent, or Firm* — Andrew Viger; Frank D. Cimino

(57) ABSTRACT

The disclosed transistor switching methodology enables independent control of transistor turn-on delay and slew rate, including charging, during a pre-charge period, a transistor control input to a threshold voltage $V_T$ with a predetermined turn-on delay; and then charging, during a switch-on period, the transistor control input from $V_T$ to an operating point with a predetermined slew rate. This methodology is adaptable to load switching applications, for example, to control a high side/low side load switch such that, during the switch on period, the output voltage supplied to the load rises from zero volts to an operating load voltage with the predetermined slew rate. In one embodiment, I_delay and I_slew_rate currents are used to charge the transistor control input respectively during the pre-charge and switch-on periods. In another embodiment, the I-delay and I-slew rate currents are controlled by a replica switch with a control input coupled to the control input of a main switch, with the replica switch characterized by a threshold voltage substantially identical to the main switch threshold voltage $V_T$.

14 Claims, 4 Drawing Sheets

TRANSISTOR SWITCH INCLUDING INDEPENDENT CONTROL OF TURN-ON AND SLEW RATE

BACKGROUND

1. Technical Field

This patent Disclosure relates generally to circuitry to control transistor switching, such as may be used in load switching applications.

2. Related Art

For some transistor switching applications, both turn-on delay and slew rate (or rise time) are a design consideration. One such application is load switching in battery powered systems, where various subsystem loads are powered on and off as needed by a power management controller.

One issue in such load switching applications is the control of inrush currents when a load is initially powered on. Inrush currents are typically controlled by controlling transistor slew rate (dV/dt), or rise time, i.e., dV/dt between turn-on and reaching the operational load voltage supplied through the load switch to the load.

FIG. 1 illustrates, for load switch 10 with an NFET switch 11, a common technique for controlling slew rate is by charging the NFET gate capacitance with a fixed current I_slew 21. Before the NFET turns-on, the fixed current source first charges gate capacitance to a threshold voltage $V_T$ for the NFET, followed by controlling switch-on slew rate for the output voltage to rise from zero volts to an operational load voltage.

While this Background information is presented in the context of load switching applications, the present Disclosure is not limited to such applications, but is more generally directed to transistor switching control.

BRIEF SUMMARY

This Brief Summary is provided as a general introduction to the Disclosure provided by the Detailed Description and Figures, outlining various aspects, features and advantages of the disclosed invention, and should not be interpreted as identifying key elements or aspects of the invention, or otherwise determining the scope of the invention, aspects of which are defined by the Claims.

The Disclosure describes apparatus and methods for independently controlling transistor turn-on delay and slew rate, such as can be used in load switching applications in which a load switch is configured and arranged for independently controlling turn-on delay and slew rate of a load switch transistor.

A methodology for independently controlling turn-on delay and slew rate for a transistor switch according to aspects of the invention can include: (a) charging, during a pre-charge period initiated by a switch-on signal, a transistor control input to $V_T$ with a predetermined turn-on delay; and then (b) charging, during a switch-on period, charging the transistor control input from $V_T$ to an operating point with a predetermined slew rate.

An embodiment of a transistor switch circuit according to aspects of the invention can include: (a) a transistor switch characterized by a turn-on threshold voltage $V_T$; and (b) switch control circuitry coupled to a control input of the transistor, and configured to independently control turn-on delay and slew rate, by: (a) during a pre-charge period initiated by a switch-on signal, charging the transistor control input to $V_T$ with a predetermined turn-on delay; and then (b) during a switch-on period, charging the transistor control input from $V_T$ to an operating point with a predetermined slew rate.

In other embodiments of the invention, the switch control circuitry can include: (a) pre-charge circuitry including a source of I_delay current; (b) switch-on circuitry including a source of I_slew_rate current; and (c) a switch network coupled between the transistor control input and respectively the pre-charge and switch-on circuitry, and configured such that (i) during the pre-charge period, the I_delay current is coupled to charge the transistor control input to $V_T$, and (ii) during the switch-on period, the I_slew_rate current is coupled to charge the transistor control input from $V_T$ to an operating point with a predetermined slew rate.

In other embodiments of the invention, the switch network can include: (a) a replica switch with a control input coupled to the control input to the transistor switch (designated a main switch), collectively the shared control inputs, the replica switch characterized by a threshold voltage substantially identical to the main switch threshold voltage $V_T$; and (b) a current source switching network controlled by the replica switch such that (i) during the pre-charge period, the replica switch is operable to connect a source of I_delay current to charge the shared control inputs to $V_T$ such that the replica switch switches on to initiate the switch-on period, and (ii) during the switch-on period, the replica switch is operable to connect a source of I_slew_rate current to charge the shared control inputs with the predetermined slew rate.

An application for embodiments of the invention can be load switching, in which: (a) the transistor is a load switch transistor coupled to a load; and (b) the switch control circuitry is configured to control switching the load switch transistor from an off state in which the load is unpowered to an on state in which the load receives an operating load voltage from a power source. For load switching applications, during the switch-on period, the load switch control gate is charged from $V_T$ to an operating point, such that an output voltage supplied to the load rises from zero volts to an operating load voltage with the predetermined slew rate. In such applications, the load switch transistor can be an NFET transistor coupled as a high-side load switch, between the power source and the load.

Other aspects and features of the claimed invention will be apparent to those skilled in the art from the following Disclosure.

DETAILED DESCRIPTION

This Description and the Figures disclose example embodiments and applications that illustrate various features and advantages of the invention, aspects of which are defined by the Claims. Known circuits, functions and operations are not described in detail to avoid unnecessarily obscuring the principles and features of the claimed invention.

Figure 1:
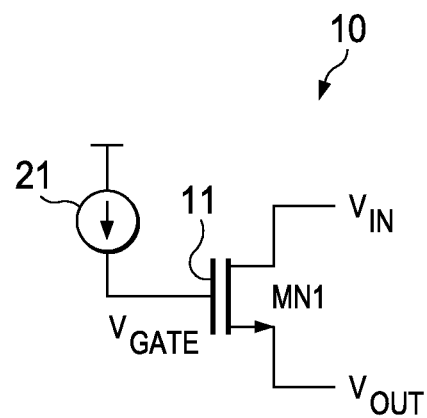
FIG. 1 illustrates conventional slew rate control for an NFET load switch.
Figure 2:
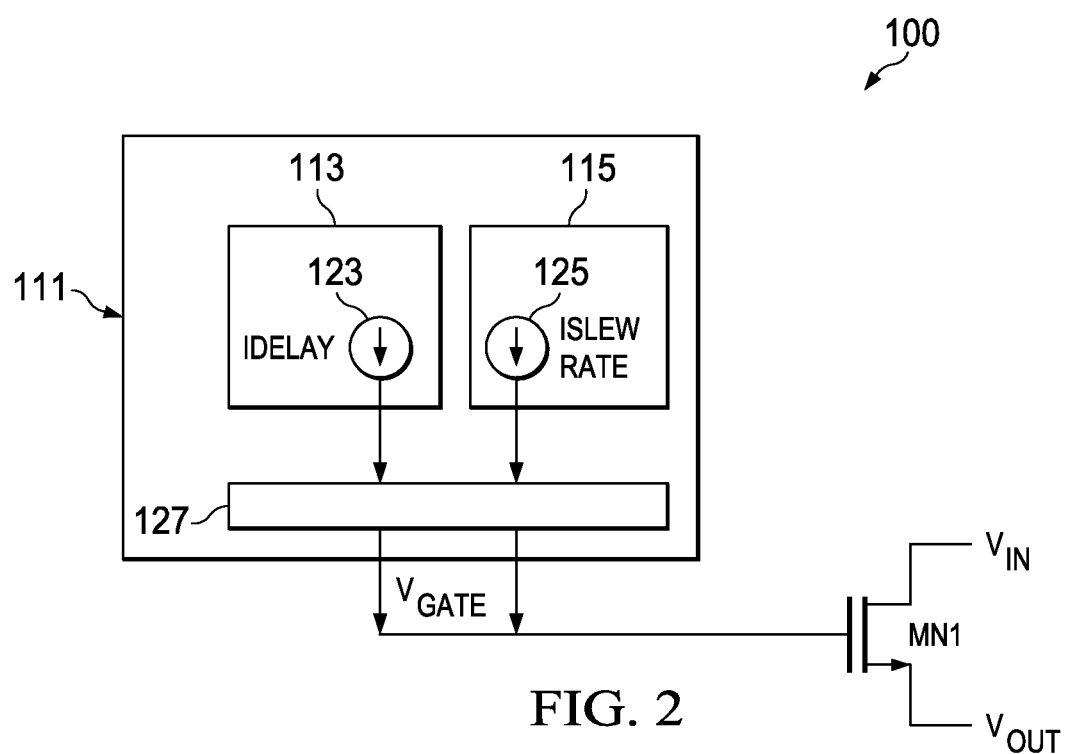
FIG. 2 illustrates an example embodiment of a transistor switch circuit with independent control of turn-on delay and slew rate, according to aspects of the claimed invention.
Figure 3A:
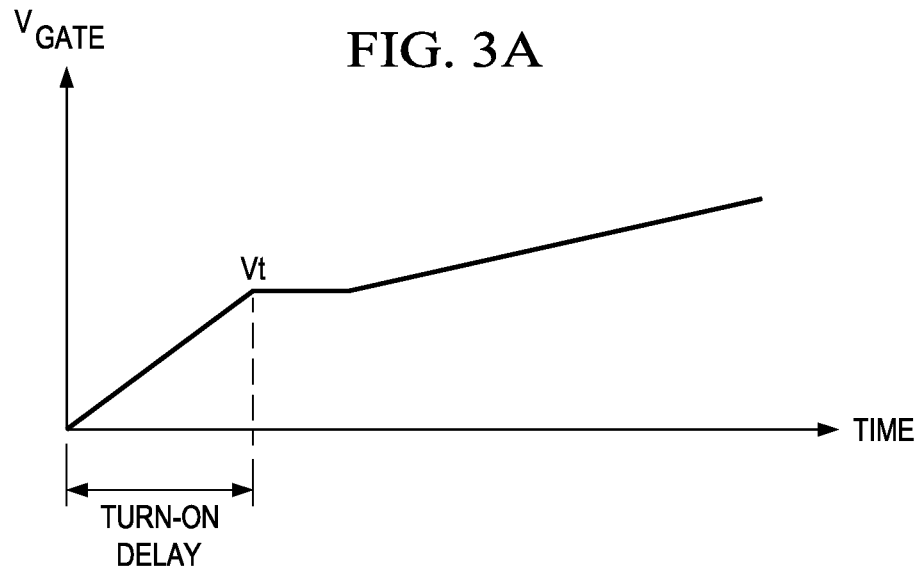
FIGS. 3A and 3B are example plots illustrating, for an example FET, (3A) transistor turn-on delay, corresponding to charging gate capacitance Vgate to a threshold voltage $V_T$, and (3B) transistor output voltage slew rate, corresponding to the rise time between transistor turn-on at $V_T$ and an operational output voltage Vout (or other operating point). According to aspects of the invention, turn-on delay corresponds to a pre-charge period, and output voltage slew rate corresponds to a switch-on period.
Figure 3B:
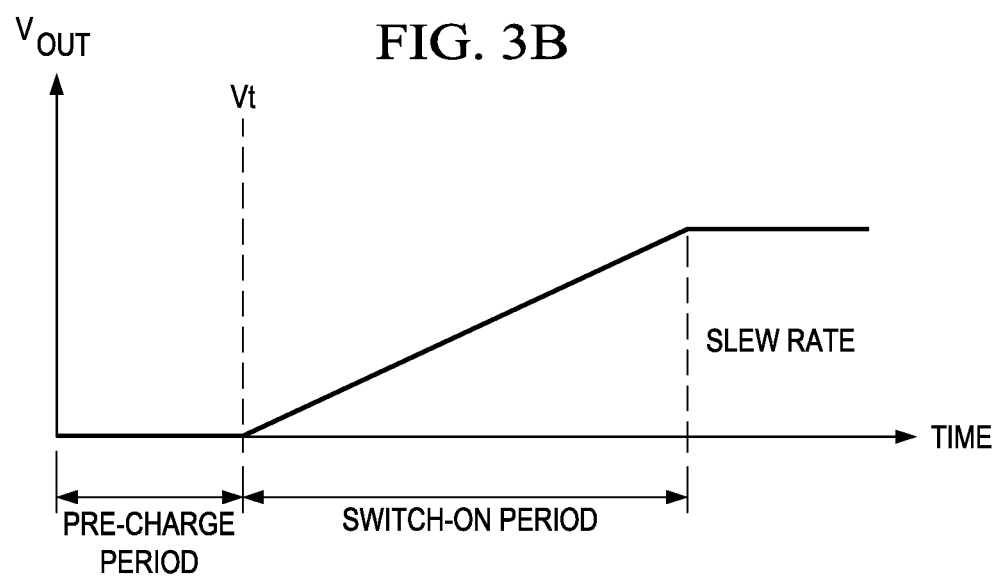

FIG. 2 illustrates an example embodiment of the methodology for independent control of transistor turn-on delay and slew-rate according to aspects of the claimed invention. FIGS. 3A and 3B are example plots illustrating, for an example FET, (3A) transistor turn-on delay, corresponding to charging gate capacitance Vgate to a threshold voltage $V_T$, and (3B) transistor output voltage slew rate, corresponding to the output voltage rise time between transistor turn-on at $V_T$ and an operational output voltage Vout (or other operating point).

Referring to FIGS. 3A and 3B, (a) turn-on delay is the time from the receipt of a switch-on signal until the transistor control input is charged (FIG. 3A, $V_{GATE}$) to a threshold voltage $V_T$, which is designated in FIG. 3B as a pre-charge period, and (b) slew rate (or rise time) is the time for the transistor control input is charged from $V_T$ to an operating point, such that output voltage rises from zero volts to an operation output voltage (FIG. 3B, $V_{OUT}$), which is designated in FIG. 3B as a switch-on period. According to aspects of the claimed invention, (a) during the pre-charge period, the transistor control input (gate) is charged to $V_T$ to establish a turn-on delay (FIG. 3A), and then, independent of the turn-on delay, (b) during the switch-on period, the transistor is switched on with transistor output voltage rising from zero volts to the $V_{OUT}$ operational output voltage with the predetermined slew rate (FIG. 3B).

Referring to FIG. 2, for the illustrated example embodiment, a transistor switch circuit 100 includes a transistor switch MN1 (characterized by a turn-on threshold voltage $V_T$) and switch control circuitry 111 configured to independently control turn-on delay and for slew rate, by (a) during a pre-charge period initiated by a switch-on signal (not illustrated), charging the MN1 control input to a threshold voltage $V_T$ with a predetermined turn-on delay (FIG. 3A, $V_{GATE}$); and then (b) during a switch-on period, charging the MN1 control input from $V_T$ to an operating point, such that output voltage rises from zero volts to an operating output voltage with a predetermined slew rate (FIG. 3B, $V_{OUT}$). In one implementation, MN1 can be operated in the linear (triode) region.

For this example embodiment, the transistor MN1 can be an NFET coupled as a high side switch with the NFET drain coupled to the $V_{IN}$ power source and an output voltage $V_{OUT}$ available at the NFET source, and with switch control circuitry 111 coupled to the NFET control gate. In an example application, the transistor switch circuit can be configured for load switching, with MN1 coupled to a load (represented by $V_{OUT}$), and the switch control circuitry 111 can be configured to control switching the load switch MN1 from an off state in which the load is unpowered to an on state in which the load receives a load voltage $V_{OUT}$ from a power source $V_{IN}$. For implementations in which MN1 is operated in the linear/triode region, during the switch-on period, the control input to MN1 is charged from turn-on $V_T$ (after the pre-charge period) to an operating point within the linear/triode region, so that the output voltage at the MN1 source rises from zero volts to the operating output load voltage with the predetermined slew rate.

For this example embodiment, the transistor switch is an NFET high side switch, such as may be used for load switching applications. However, the switch control methodology of the claimed invention is adaptable to (a) PFET switches, (b) bipolar and other transistor technologies and (c) low side as well as high side configurations.

In an example embodiment, switch control circuitry 111 can be implemented with pre-charge circuitry 113 that can include a source of I_delay current such as an I_delay current source 123, and switch-on circuitry 115 that can include a source of I_slew_rate current such as an I_slew_rate current source 125. Switch control circuitry 111 can further include charge control circuitry 127 configured such that (i) during the pre-charge period, the I_delay current such as from the I_delay current source 123 is coupled to charge the MN1 control input to the turn-on $V_T$, and (ii) during the switch-on period, the I_slew_rate current such as from the I_slew_rate current source 125 is coupled to the control input to MN1, which is charged from turn-on $V_T$ to the operating point, so that the output voltage at the MN1 source rises from zero volts to the load voltage with the predetermined slew rate.

Figure 4:
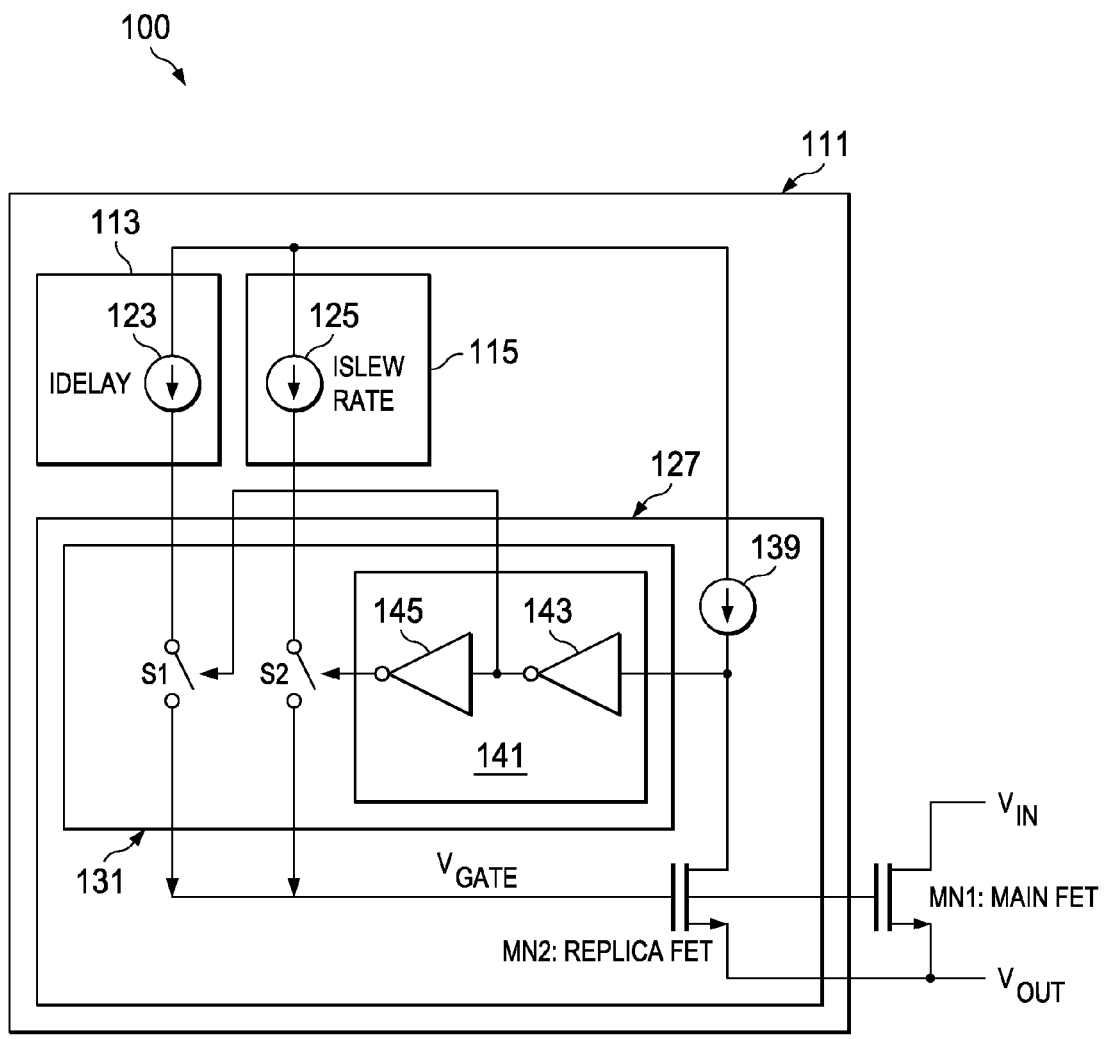
FIG. 4 illustrates an example embodiment of a transistor switch circuit with an example NFET switch, and example switch control circuitry configured to independently control turn-on delay and slew rate, including a shared-gate replica NFET and I_delay and I_slew_rate current sources cooperatively switched for independently charging, during a pre-charge period, gate capacitance to control turn-on delay (I_delay), and charging gate capacitance to control slew rate (I_slew_rate), according to aspects of the claimed invention.

FIG. 4 illustrates an example embodiment of the transistor switch circuit 100 in which the charge control circuitry 127 is implemented with a replica switch, MN2, and a switch network 131. A current source 139 is used to monitor when the replica FET is turned on.

The main switch MN1 and replica switch MN2 are in a shared control gate (shared control input) configuration, with the MN2 control gate coupled to the MN1 control gate—the MN2/MN1 coupled gates are collectively referred to as the shared control gates. Replica switch MN2 is preferable smaller than the MN1 main switch (for example, 1:1000), and is characterized by a threshold voltage substantially identical to the MN1 threshold voltage $V_T$. In one implementation, both replica MN2 and main switch MN1 can be operated in the linear (triode) region.

Replica switch MN2 is configured to control switch network 131 such that (i) during the pre-charge period, the replica switch is operable to couple an I_delay current such as from an I_delay current source 123 to charge the MN2/MN1 shared control gates to the turn-on $V_T$ such that replica switch MN2 switches on to initiate the switch-on period, and (ii) during the switch-on period, replica switch MN2 is operable to couple to the MN2/MN1 shared control gates an I_slew_rate current, such as from an I_slew_rate current source 125, to switch on the main switch MN1 with the predetermined slew rate, by charging the MN1 control gate from turn-on $V_T$ to the operating point, so that the output voltage at the MN1 source rises from zero volts to the load voltage with the predetermined slew rate An example switch network 131 can include: (a) current control switches S1 and S2 coupled between the MN2/MN1 shared control gates and respectively I_delay and I_slew_rate current sources 123 and 125 as sources of respectively the I_delay and I_slew_rate currents; and (b) switch control circuitry 141 coupled between the replica switch MN2 and S1/S2. Replica switch MN2 is operable to control S1/S2 to cooperatively couple the MN2/MN1 shared control gates respectively to the I_delay current source 123 during the pre-charge period, and the I_slew_rate current source 125 during the switch-on period.

Switch control circuitry 141 can be implemented with an inverter chain 141, including inverters 143 and 145 configured with an output of inverter 143 coupled to an input of inverter 145. The input end of the inverter chain (input to inverter 143) is coupled to the drain of replica switch MN2, and the outputs of inverters 143/145 respectively control current control switches S1/S2. Specifically, replica switch MN2 complementarily switches S1/S2 between on and off states, such that (i) during the pre-charge period, S1 is on to connect the I_delay current from the I_delay current source 123 to the MN2/MN1 shared control gates, and S2 is off, and (ii) during the switch-on period, S2 is on to connect the I_slew_rate current from I_slew_rate current source 125 to the MN2/MN1 shared control gates, and S1 is off.

Thus, at the start of the pre-charge period, both the main switch MN1 and the smaller replica switch MN2 are disabled. During the pre-charge period, the drain of replica switch MN2 is pulled to the supply, closing S1 (conducting), and opening switch S2 (non-conducting). Since S1 is closed, I_delay current source 123, pre-charges gate capacitance to $V_T$, initiating the switch-on period. During the switch-on period, when the MN2/MN1 gate voltage reaches $V_T$, replica switch MN2 and main switch MN1 turn-on, pulling down the MN2 drain, and switching states for the current control switches S1/S2, i.e. S1 opens (non-conducting) while S2 closes (conducting). This operation of switch network 131 switches the gate charge current from I_delay (pre-charge) to I_slew_rate (switch-on).

In accordance with aspects of the claimed invention, as design parameters, the I_delay charge current can be configured for a specified main switch MN1 turn-on delay, and, independent of I_delay, the I_slew_rate charge current can be configured for a specified main switch MN1 slew rate.

In an example application, the transistor control methodology according to aspects of the invention can be used for load switching. In an example embodiment, as illustrated in FIG. 2, MN1 can be an FET load switch (characterized by a turn-on threshold voltage $V_T$) coupling a load (represented by $V_{OUT}$) to a power source (represented by $V_{IN}$). Switch control circuitry 111 is coupled to the load switch MN1 control gate, and configured to control switching MN1 between off and on states, including switching from an off state in which the load ($V_{OUT}$) is unpowered to an on state in which the load receives an operating load voltage ($V_{OUT}$) from the power source ($V_{IN}$). Switch control circuitry 111 is further configured to independently control a turn-on delay and a slew rate of the load switch by: (a) during a pre-charge period initiated by a switch-on signal (not illustrated), charging the MN1 control gate to $V_T$ with a predetermined turn-on delay (FIG. 3A, $V_{GATE}$); and then (b) during a switch-on period, charging the MN1 control gate from $V_T$ to an operating point, so that the output voltage at the MN1 source rises from zero volts to the load voltage with the predetermined slew rate (FIG. 3B, $V_{OUT}$). As illustrated in the example embodiment in FIG. 2, the load switch can be an NFET transistor, coupled as a high-side load switch.

As illustrated in FIG. 4, the load switch FET can be an NFET, and can be coupled as a high-side load switch transistor between the load ($V_{OUT}$) and the power source ($V_{IN}$).

As described above, the load switch circuit can be configured to independently control turn-on delay and slew rate, during respective pre-charge and switch-on periods, by various embodiments, including for example (a) implementing switch control circuitry 111 with pre-charge and switch-on circuitry 113 and 115, including respectively sources of I_delay and I_slew_rate current (such as I_delay and I_slew_rate sources 123 and 125), operable with the charge control circuitry 117, (b) implementing charge control circuitry 117 with a replica switch MN2 coupled to the main load switch MN1 in a shared control gate configuration, the replica switch MN2 operable with the switch network 131; (c) implementing the switch network 131 with current control switches S1/S2 and switch control circuitry 141 cooperatively controlled by replica switch MN2, and (d) implementing switch control circuitry 141 as an inverter chain with inverters 143/145 coupled between replica switch MN2 and the current control switches S1/S2 such that replica switch MN2 is operable to complementarily connect to the MN2/MN1 shared control gates respectively to I_delay current source 123 (pre-charge period) and I_slew_rate current source 125 (switch-on period).

Thus, referring to FIGS. 2 and 3A/3B, according to aspects of the invention, the methodology for independently controlling transistor turn-on delay and the slew rate can include: (a) during a pre-charge period initiated by a switch-on signal, charging the MN1 control input to $V_T$ with a predetermined turn-on delay; and then (b) during a switch-on period, charging the MN1 control input from $V_T$ to an operating point with a predetermined slew rate. In other aspects, the methodology can include: (a) during the pre-charge period, coupling a source of I_delay current (such as I_delay current source 123) to a control input of the transistor to charge the transistor to $V_T$; and (b) during the switch-on period, coupling a source of I_slew_rate current (such as I_slew_rate current source 125) to the control input to switch on the transistor at the predetermined slew rate. In other aspects, the methodology can include: (a) during the pre-charge period, cooperatively operating replica switch MN2 and switch network 131 to couple a source of I_delay current (such as I_delay current source 123) to charge the shared control inputs of MN2/MN1 to $V_T$; such that replica switch MN2 switches on to initiate the switch-on period; and (b) during the switch-on period, cooperatively operating replica switch MN2 and switch network 131 to couple a source of I_slew_rate current (such as I_slew_rate current source 125) to charge main switch MN1 control gate with the predetermined slew rate. In other aspects, the methodology can include cooperatively operating replica switch MN2 and current control switches S1/S2 to couple the MN2/NM1 shared control inputs respectively to I_delay current source 123 during the pre-charge period, and I_slew_rate current source 125 during the switch-on period. In other aspects, the methodology can be used in load switching applications in which a load switch transistor is controlled to switch from an off state in which the load is unpowered to an on state in which an operating load voltage is supplied to the load from a power source, and specifically, during the switch-on period, the transistor load switch is controlled such that output voltage rises from zero volts to the operating load voltage with the predetermined slew rate.

Figure 5:
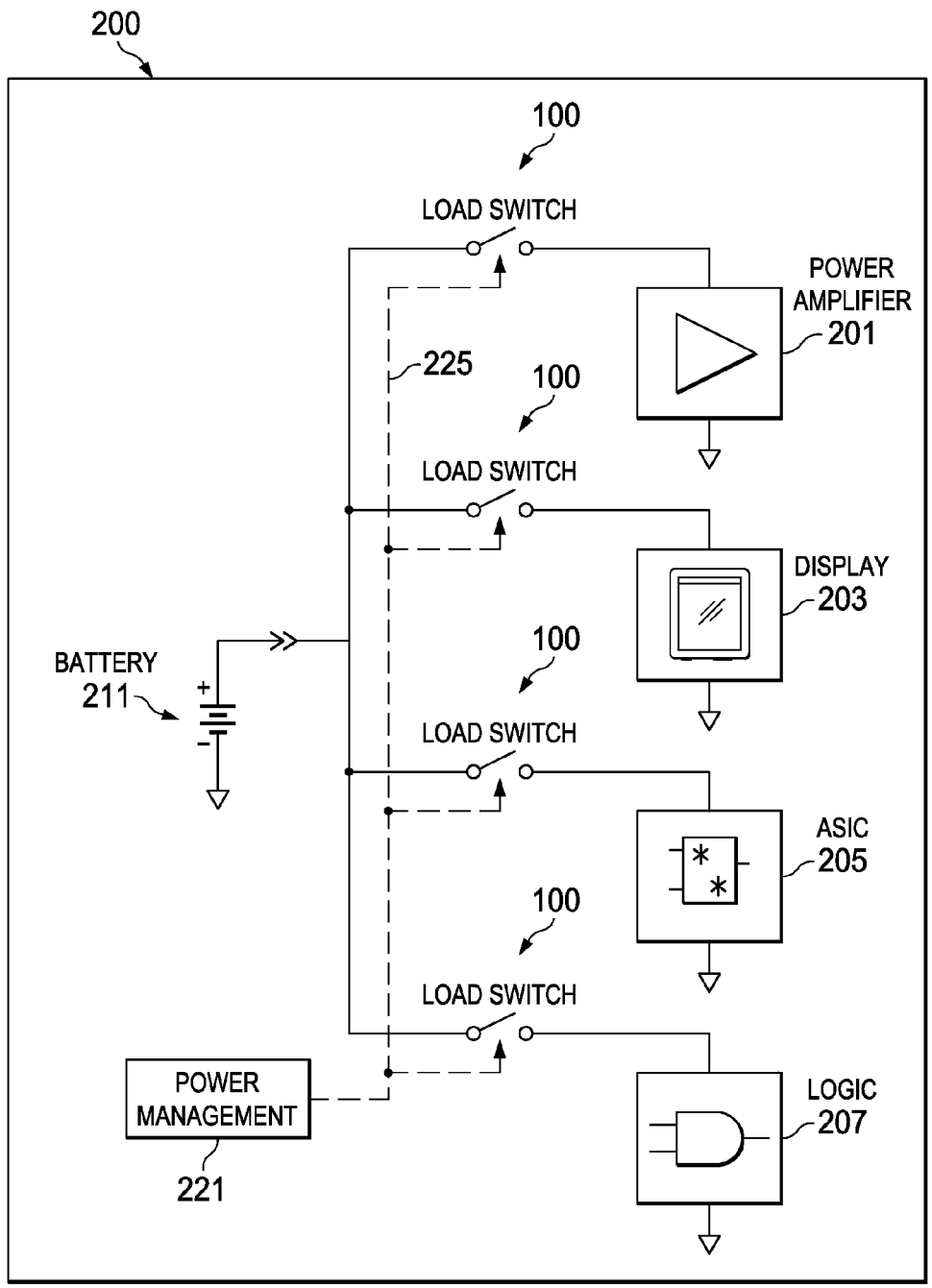
FIG. 5 illustrates an example system in which load switching can be implemented according to aspects of the claimed invention.

FIG. 5 illustrates an example system 200 in which load switching can be implemented according to aspects of the claimed invention. System 200 includes a multiple load subsystems, such as power amplifier 201, Display 203, ASIC 205 and Logic 207. The load subsystems receive power from a power source, such as battery 211, which each load subsystem coupled to batter 211 by a load switch 100, configures according to aspects of the invention. A power management unit 221 controls each load switch 100, switching on/off power to selected subsystem loads 201-207 by controlling the load switches 100.

According to aspects of the claimed invention, in response to a switch-on signal 225 from power management unit 221, a load switch 100 switches on with independently controlled turn-on delay and slew rate. In response to the switch-on signal, the load switch transistor (such as main switch MN1 in FIGS. 2 and 4) is controlled (a) during a pre-charge period, to charge the load switch transistor to the threshold voltage $V_T$ with a predetermined turn-on delay; and then (b) during a switch-on period, to switch on the load switch transistor so that output voltage rises from zero volts to an operating load voltage with a predetermined slew rate. As noted above, as design parameters, the transistor switch control circuit can be configured for a specified main switch MN1 turn-on delay, and, independent of turn-on delay, a specified main switch MN1 slew rate This Description of example embodiments and applications, and generally associated methods, illustrate various aspects and features of the invention. These example embodiments and applications may be used by those skilled in the art as a basis for design modifications, substitutions and alternatives to construct other embodiments, including adaptations for other applications, Accordingly, this Description does not limit the scope of the invention, which is defined by the Claims

The invention claimed is:

1. A transistor switch circuit, comprising
a transistor switch characterized by a turn-on threshold voltage VT; and
switch control circuitry coupled to a control input of the transistor, and configured to independently control turn-on delay and output voltage slew rate, including:
pre-charge circuitry including a source of I delay current operable during a pre-charge period initiated by a switch-on signal, to charge the transistor control input to VT with a predetermined turn-on delay;
switch-on circuitry including a source of I slew rate current operable during a switch-on period, to charge the transistor control input from VT to an operating point with a predetermined slew rate; and
charge control circuitry including:
a replica switch with a control input coupled to the control input of the transistor switch, collectively the shared control inputs, the replica switch characterized by a threshold voltage substantially identical to the transistor switch threshold voltage VT; and
a switch network controlled by the replica switch such that (a) during the pre-charge period, the replica switch is operable to connect the I delay current to charge the shared control inputs to VT such that the replica switch switches on to initiate the switch-on period, and (b) during the switch-on period, the replica switch is operable to connect the I slew rate current to charge the transistor switch control input to the operating point with the predetermined slew rate.

2. The transistor switch circuit of claim 1, wherein the transistor is an NFET coupled to a power source as a high-side switch.

3. The transistor switch circuit of claim 1, wherein the transistor is a load switch coupled to a load; and
wherein the switch control circuitry is configured to control switching the load switch from an off state in which the load is unpowered to an on state in which the load receives a load voltage from a power source; and
wherein, during the switch-on period, an output voltage supplied to the load rises from zero volts to an operating load voltage with the predetermined slew rate.

4. The transistor switch circuit of claim 1, wherein the switch network comprises:

first and second current control switches coupled between the shared control inputs and respectively the I_delay and I_slew_rate current sources as sources of respectively the I_delay and I_slew_rate currents; and
switch control circuitry coupled between the replica switch and the first and second current control switches;
such that the replica switch is operable to cooperatively control the first and second current control switches to couple the shared control inputs respectively to the I_delay current source during the pre-charge period and the I_slew_rate current source during the switch-on period.

5. The transistor switch circuit of claim 4, wherein the switch control circuitry comprises:
an inverter chain with an output of a first inverter coupled to an input to a second inverter;
the inverter chain configured with an input end (an input to the first inverter) coupled to a first terminal of the replica switch, and with an output of the first inverter coupled to a control input to the first current control switch, and an output of the second inverter coupled to a control input to the second current control switch;
such that the replica switch is operable to complementarily switch the first and second current control switches between on and off states, such that (i) during the pre-charge period, the first current control switch is on to connect the I_delay current source to the shared control inputs, and the second current control switch is off, and (ii) during the switch-on period, the second current control switch is on to connect the I_slew_rate current source to the shared control inputs, and the first current control switch is off.

6. A load switch circuit for coupling a load to a power source, comprising
an FET load switch coupled to the load, the FET characterized by a turn-on threshold voltage VT associated with the capacitance of a control gate of the FET; and
switch control circuitry coupled to the control gate of the load switch, and configured to control switching the load switch between off and on states, including switching from an off state in which the load is unpowered to an on state in which the load receives an operating load voltage from the power source;
the switch control circuitry is further configured to independently control a turn-on delay and a slew rate of the load switch by:
pre-charge circuitry including a source of I delay current operable during a pre-charge period initiated by a switch-on signal, to charge the load switch control gate to VT with a predetermined turn-on delay;
switch-on circuitry including a source of I slew rate current operable during a switch-on period, to charge the load switch control gate from VT to an operating point with a Predetermined slew rate, such that an output voltage supplied to the load rises from zero volts to an operating load voltage with the predetermined slew rate; and
charge control circuitry including:
a replica switch with a control input coupled to the control input of the load switch, collectively the shared control inputs, the replica switch characterized by a threshold voltage substantially identical to the load switch threshold voltage VT; and
a switch network controlled by the replica switch such that (a) during the pre-charge period, the replica switch is operable to connect the I delay current to charge the shared control inputs to VT such that the replica switch switches on to initiate the switch-on period, and (b) during the switch-on period, the replica switch is operable to connect the I slew rate current to charge the load switch control gate to the operating point with the predetermined slew rate.

7. The load switch circuit of claim 6, wherein the FET load switch is an NFET.

8. The load switch circuit of claim 6, wherein the FET load switch is coupled as a high-side load switch transistor between the load and the power source.

9. The load switch circuit of claim 6, wherein the switch network comprises:
   first and second current control switches coupled between the shared control gates and respectively I_delay and I_slew_rate current sources as sources of respectively the I_delay and I_slew_rate currents;
   switch control circuitry coupled between the replica switch and the first and second current control switches;
   such that the replica switch is operable to cooperatively control the first and second current control switches to couple the shared control gates respectively to the I_delay current source during the pre-charge period and the I_slew_rate current source during the switch-on period.

10. The load switch circuit of claim 9, wherein the switch control circuitry comprises:
   an inverter chain with first and second inverters configured such that an output of the first inverter is coupled to an input of the second inverter;
   the inverter chain configured with an input end (an input to the first inverter) coupled to a first terminal of the replica switch, and with an output of the first inverter coupled to a control input to the first current control switch, and an output of the second inverter coupled to a control input to the second current control switch;
   such that the replica switch is operable to complementarily switch the first and second current control switches between on and off states, such that (i) during the pre-charge period, the first current control switch is on to connect the I_delay current source to the shared control gates, and the second current control switch is off, and (ii) during the switch-on period the second current control switch is on to connect the I_slew_rate current source to the shared control gates, and the first current control switch is off.

11. A method of controlling the switching of a transistor characterized by a turn-on threshold voltage VT, the method effected by incorporating with the transistor a replica switch with a control input coupled to a control input of the transistor, collectively the shared control inputs, the replica switch characterized by a threshold voltage substantially identical to the transistor threshold voltage VT, the method comprising
   charging, during a pre-charge period initiated by a switch-on signal, the shared control inputs to VT with a predetermined turn-on delay by coupling a source of I delay current to the shared control inputs, such that the replica switch switches on to initiate a switch-on period; and then
   charging, during the switch-on period, the transistor control input from VT to an operating point with a predetermined slew rate, by switching the replica switch to couple a source of I slew rate current to the transistor control input;
   thereby independently controlling the transistor turn-on delay and the transistor slew rate.

12. The method of claim 11, wherein the transistor is a load switch transistor coupled to a load; and wherein during the switch-on period, an output voltage of the load switch rises from zero volts to an operating load voltage with the predetermined slew rate, such that the load switch transistor switches from an off state in which the load is unpowered to an on state in which an operating load voltage is supplied to the load from a power source.

13. The method of claim 12, wherein the transistor is an NFET transistor coupled as a high-side load switch with a drain of the NFET coupled to the power source and a source of the NFET coupled to the load.

14. The method of claim 11, further comprising first and second current control switches coupled between the shared control inputs and respectively I_delay and I_slew_rate current sources as sources of respectively the I_delay and I_slew_rate currents, and further comprising cooperatively operating the replica switch and the first and second current control switches to couple the shared control inputs respectively to the I_delay current source during the pre-charge period, and the I_slew_rate current source during the switch-on period.

* * * * *